US011140783B2

(12) United States Patent
Zaigo et al.

(10) Patent No.: US 11,140,783 B2
(45) Date of Patent: Oct. 5, 2021

(54) APPARATUS FOR MAKING WIRING BOARD

(71) Applicant: TOYOTA JIDOSHA KABUSHIKI KAISHA, Toyota (JP)

(72) Inventors: Takeshi Zaigo, Seto (JP); Makoto Fukunishi, Okazaki (JP); Yoichi Miyagawa, Miyoshi (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 286 days.

(21) Appl. No.: 16/127,387

(22) Filed: Sep. 11, 2018

(65) Prior Publication Data

US 2019/0090351 A1 Mar. 21, 2019

(30) Foreign Application Priority Data

Sep. 19, 2017 (JP) ............................ JP2017-178911

(51) Int. Cl.
*H05K 3/00* (2006.01)
*H05K 1/11* (2006.01)
*H05K 1/03* (2006.01)
*H05K 3/10* (2006.01)

(52) U.S. Cl.
CPC ............ *H05K 3/0014* (2013.01); *H05K 1/03* (2013.01); *H05K 1/11* (2013.01); *H05K 3/0047* (2013.01); *H05K 3/101* (2013.01); *H05K 2201/09118* (2013.01); *H05K 2203/128* (2013.01)

(58) Field of Classification Search
CPC .. H05K 1/03; H05K 1/11; H05K 2201/09118; H05K 2203/128; H05K 3/0014; H05K 3/0047; H05K 3/101
See application file for complete search history.

(56) References Cited

U.S. PATENT DOCUMENTS

| | | | | |
|---|---|---|---|---|
| 3,729,819 | A * | 5/1973 | Horie | H05K 3/207 174/259 |
| 7,617,600 | B2 * | 11/2009 | Takeuchi | H05K 3/20 156/233 |
| 10,051,167 | B2 * | 8/2018 | Wang | G02B 7/10 |
| 2002/0041110 | A1 | 4/2002 | Odashima et al. | |
| 2012/0128866 | A1 | 5/2012 | Eichlseder et al. | |
| 2019/0090351 | A1 * | 3/2019 | Zaigo | H05K 3/101 |

FOREIGN PATENT DOCUMENTS

| | | | |
|---|---|---|---|
| CN | 102427924 | A | 4/2012 |
| JP | 08-148805 | A | 6/1996 |
| JP | 2002-019544 | A | 1/2002 |

* cited by examiner

*Primary Examiner* — Minh N Trinh
(74) *Attorney, Agent, or Firm* — Sughrue Mion, PLLC

(57) ABSTRACT

A manufacturing apparatus of a wiring board includes: a fixed die; a movable die configured to abut with the fixed die so as to form a cavity in which a resin substrate having a wiring gutter is to be molded; and an injection machine configured to inject molten resin into the cavity via the fixed die. The movable die includes a movable main mold, and a movable core having a nested structure in which the movable core is slidably accommodated in the movable main mold. A wall surface of the movable core has a projection portion that molds the wiring gutter. An injector configured to inject molten metal into the wiring gutter via the projection portion is provided inside the movable core.

4 Claims, 8 Drawing Sheets

APPARATUS FOR MAKING WIRING BOARD

INCORPORATION BY REFERENCE

The disclosure of Japanese Patent Application No. 2017-178911 filed on Sep. 19, 2017 including the specification, drawings and abstract is incorporated herein by reference in its entirety.

BACKGROUND

1. Technical Field

The present disclosure relates to a manufacturing method of a wiring board and a manufacturing apparatus thereof.

2. Description of Related Art

There has been known a manufacturing method of a wiring board in which a circuit wiring is formed by filling conductive ink or conductive paste into a wiring gutter provided on a resin substrate. Japanese Unexamined Patent Application Publication No. 8-148805 (JP 8-148805 A) describes a technique in which a mask coating is formed in a region, on a resin substrate, other than a wiring gutter before the wiring gutter is filled with conductive paste, and the mask coating is peeled off after the wiring gutter is filled with the conductive paste.

SUMMARY

The inventors found the following problems in terms of a manufacturing method of a wiring board and a manufacturing apparatus thereof. As described above, in the method described in JP 8-148805 A, it is necessary to perform a step of forming a circuit wiring in the wiring gutter separately from a step of molding the resin substrate by injection molding, and besides, it is necessary to form and peel off the mask coating at the time of forming the circuit wiring in the wiring gutter. Thus, the method described in JP 8-148805 A has a low productivity.

The disclosure provides a manufacturing method of a wiring board and a manufacturing apparatus thereof each of which is excellent in productivity.

A first aspect of the disclosure relates to a manufacturing apparatus of a wiring board, and the manufacturing apparatus includes a fixed die, a movable die, and an injection machine. The movable die is configured to abut with the fixed die so as to form a cavity in which a resin substrate having a wiring gutter is to be molded. The injection machine is configured to inject molten resin into the cavity via the fixed die. The movable die includes a movable main mold, and a movable core having a nested structure in which the movable core is slidably accommodated in the movable main mold. A wall surface of the movable core has a projection portion that molds the wiring gutter. An injector configured to inject molten metal into the wiring gutter via the projection portion is provided inside the movable core. The manufacturing apparatus is configured such that, after the molten resin injected from the injection machine solidifies inside the cavity such that the resin substrate having the wiring gutter is molded, the movable core moves back, and then, the molten metal is injected into the wiring gutter from the injector.

In the manufacturing apparatus according to the first aspect of the disclosure, the movable die is configured such that the movable core having a mold surface provided with the projection portion for molding the wiring gutter has a nested structure in which the movable core is slidably accommodated in the movable main mold. The injector configured to inject molten metal into the wiring gutter via the projection portion is provided inside the movable core. After the molten resin injected from the injection machine solidifies inside the cavity so that the resin substrate having the wiring gutter is molded, the movable core moves back, and then, the molten metal is injected into the wiring gutter from the injector. That is, the manufacturing apparatus according to the first aspect of the disclosure is excellent in productivity because a wiring line can be formed inside a die for injection molding and it is unnecessary to form and peel off a mask coating.

In the first aspect of the disclosure, a seal lip molding groove may be formed in a root of the projection portion so as to surround the projection portion and get into a lower side of the projection portion. The seal lip molding groove may be configured to mold a seal lip in a peripheral edge of the wiring gutter of the resin substrate to be molded, such that the seal lip extends from a wall surface of the wiring gutter, inclines toward the wiring gutter side, and projects from a principal surface of the resin substrate. With such a configuration, it is possible to further restrain a leak of the molten metal from the wiring gutter.

In the first aspect of the disclosure, a supply tank configured to supply the molten metal to the injector may be placed on an outer wall of the movable main mold. With such a configuration, the molten metal can be supplied to the injector without removing the injector, thereby further improving the productivity.

In the first aspect of the disclosure, the movable core may be configured to be slidable in a direction where the projection portion projects.

A second aspect of the disclosure relates to a manufacturing method of a wiring board, and the manufacturing method includes: injecting molten resin into a cavity formed between a fixed die and a movable die abutting with each other, the movable die including a movable main mold and a movable core having a nested structure in which the movable core is slidably accommodated in the movable main mold, a wall surface of the movable core having a projection portion that molds a wiring gutter, an injector configured to inject molten metal into the wiring gutter via the projection portion being provided inside the movable core; molding a resin substrate having the wiring gutter by solidifying the molten resin in the cavity; and injecting the molten metal into the wiring gutter from the injector after the resin substrate is molded and the movable core moves back.

In the manufacturing method according to the second aspect of the disclosure, the movable die is configured such that the movable core having a mold surface provided with the projection portion for molding the wiring gutter is slidably accommodated in the movable main mold, and an injector configured to inject molten metal into the wiring gutter via the projection portion is provided inside the movable core. The molten resin is injected into the cavity and the molten resin is solidified inside the cavity so that the resin substrate having the wiring gutter is molded. After that, the movable core moves back, and then, the molten metal is injected into the wiring gutter from the injector. That is, the manufacturing method according to the second aspect of the disclosure is excellent in productivity because a wiring line can be formed inside a die for injection molding and it is unnecessary to form and peel off a mask coating.

The disclosure can provide a manufacturing method of a wiring board and a manufacturing apparatus thereof each of which is excellent in productivity.

BRIEF DESCRIPTION OF THE DRAWINGS

Features, advantages, and technical and industrial significance of exemplary embodiments will be described below with reference to the accompanying drawings, in which like numerals denote like elements, and wherein.

DETAILED DESCRIPTION OF EMBODIMENTS

Concrete embodiments to which the disclosure is applied will be described below in detail with reference to the drawings. However, the disclosure is not limited to the following embodiments. Further, the following description and drawings are simplified appropriately for clarification of the description.

First Embodiment

Configuration of Manufacturing Apparatus of Wiring Board

Figure 1:
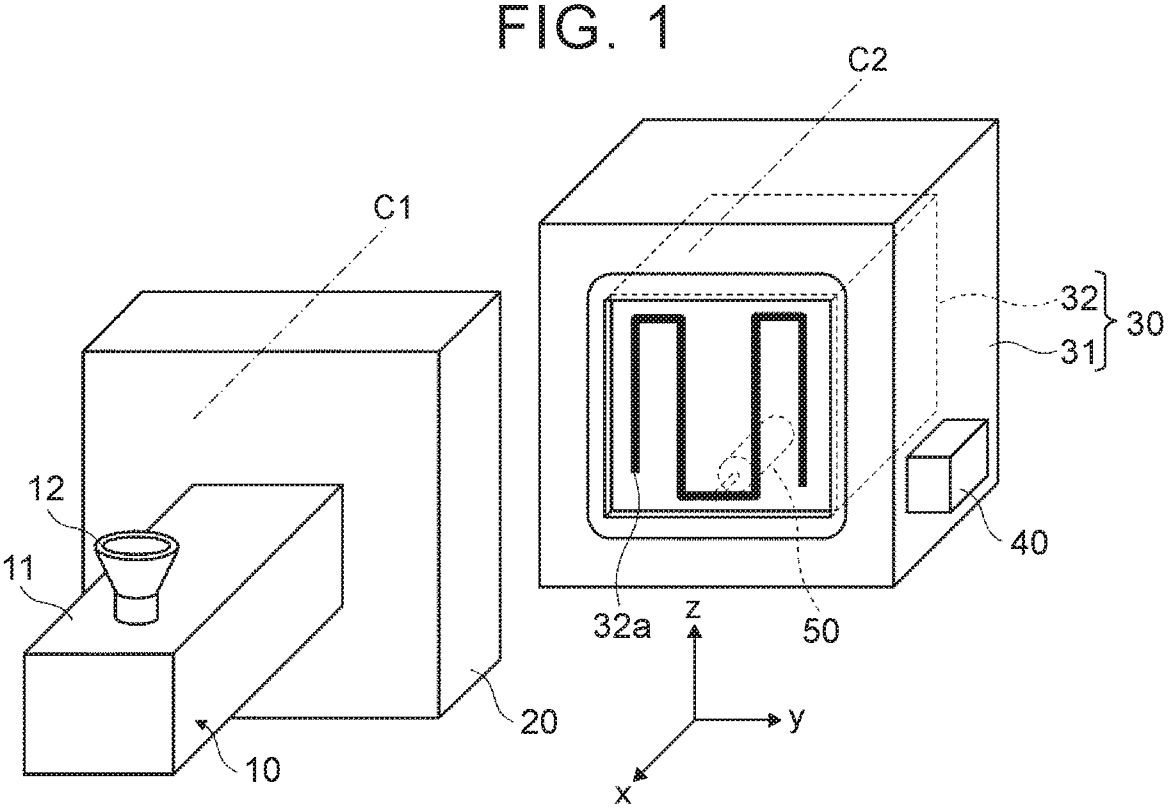
FIG. 1 is a schematic perspective view of a manufacturing apparatus of a wiring board according to a first embodiment.
Figure 2:
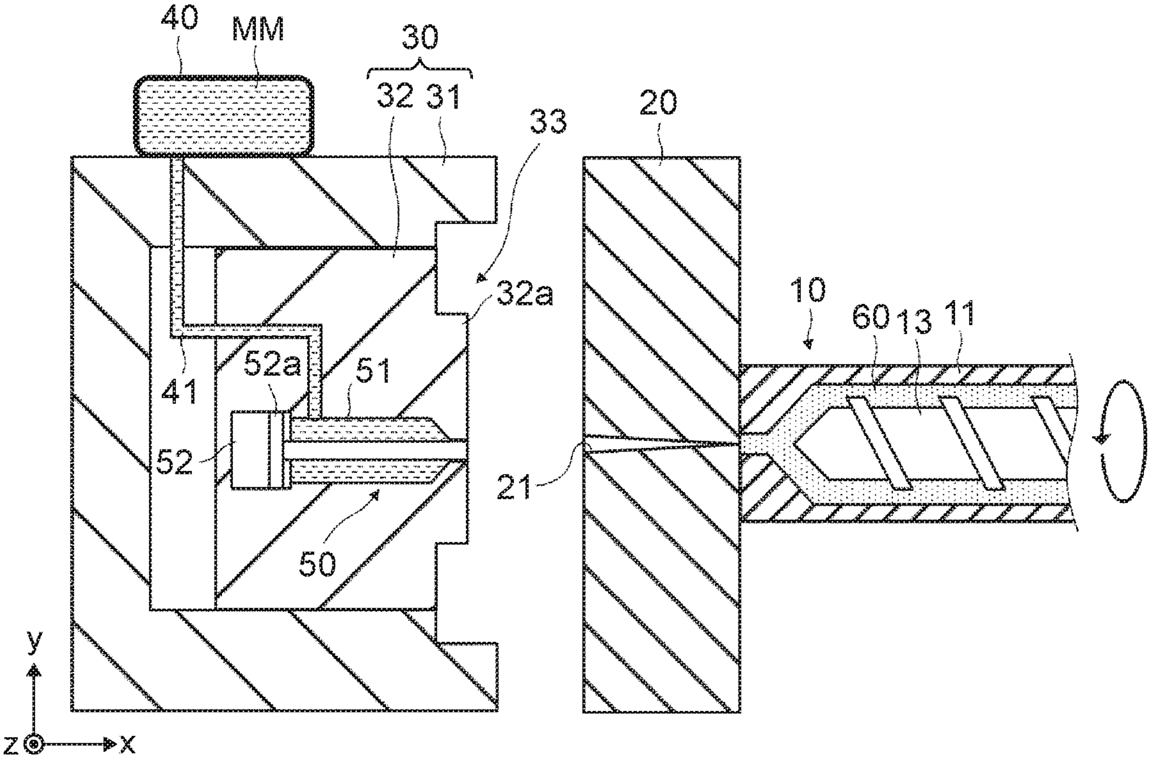
FIG. 2 is a schematic horizontal sectional view of the manufacturing apparatus according to the first embodiment.

First described is a configuration of a manufacturing apparatus of a wiring board according to a first embodiment with reference to FIGS. 1 and 2. FIG. 1 is a schematic perspective view of the manufacturing apparatus according to the first embodiment. FIG. 2 is a schematic horizontal sectional view of the manufacturing apparatus according to the first embodiment. The manufacturing apparatus according to the first embodiment is an injection molding apparatus for molding a resin substrate including a wiring gutter. As illustrated in FIGS. 1, 2, the manufacturing apparatus according to the first embodiment includes an injection machine 10, a fixed die 20, a movable die 30, a supply tank 40, and an injector 50. FIGS. 1, 2 illustrate a state where the fixed die 20 and the movable die 30 are separated from each other before injection molding.

Naturally, an xyz right handed coordinate system in FIGS. 1, 2, and other drawings is illustrated for convenience of description of a positional relationship between constituents. Generally, the z-axis positive direction indicates a vertically upper side and the xy plane is a horizontal plane, and these are common between the drawings. Further, a central axis C1 of the fixed die 20, parallel to the x-axis, and a central axis C2 of the movable die 30, parallel to the x-axis, in FIG. 1 are the same. However, in FIG. 1, in order to easily understand the configuration of the movable die 30, the movable die 30 is shifted in the y-axis positive direction.

The injection machine 10 is a screw-type injection machine and includes a cylinder 11, a hopper 12, and a screw 13, as illustrated in FIGS. 1, 2. As illustrated in FIG. 1, the hopper 12 into which resin pellets (not shown) as a material of a resin substrate are poured is provided on the upper side of an end, in the x-axis positive direction, of the cylinder 11 extending in the x-axis direction. Further, as illustrated in FIG. 2, the screw 13 extending in the x-axis direction is accommodated inside the cylinder 11 extending in the x-axis direction. As illustrated in FIG. 2, the resin pellets supplied from the hopper 12 are compressed toward the tip end (that is, toward the x-axis negative direction) of the rotating screw 13 from its root portion, so that the resin pellets are turned into a molten resin 60. Although not illustrated in the figure, a motor is connected to the screw 13 as a drive source via a speed reducer, for example.

Figure 3:
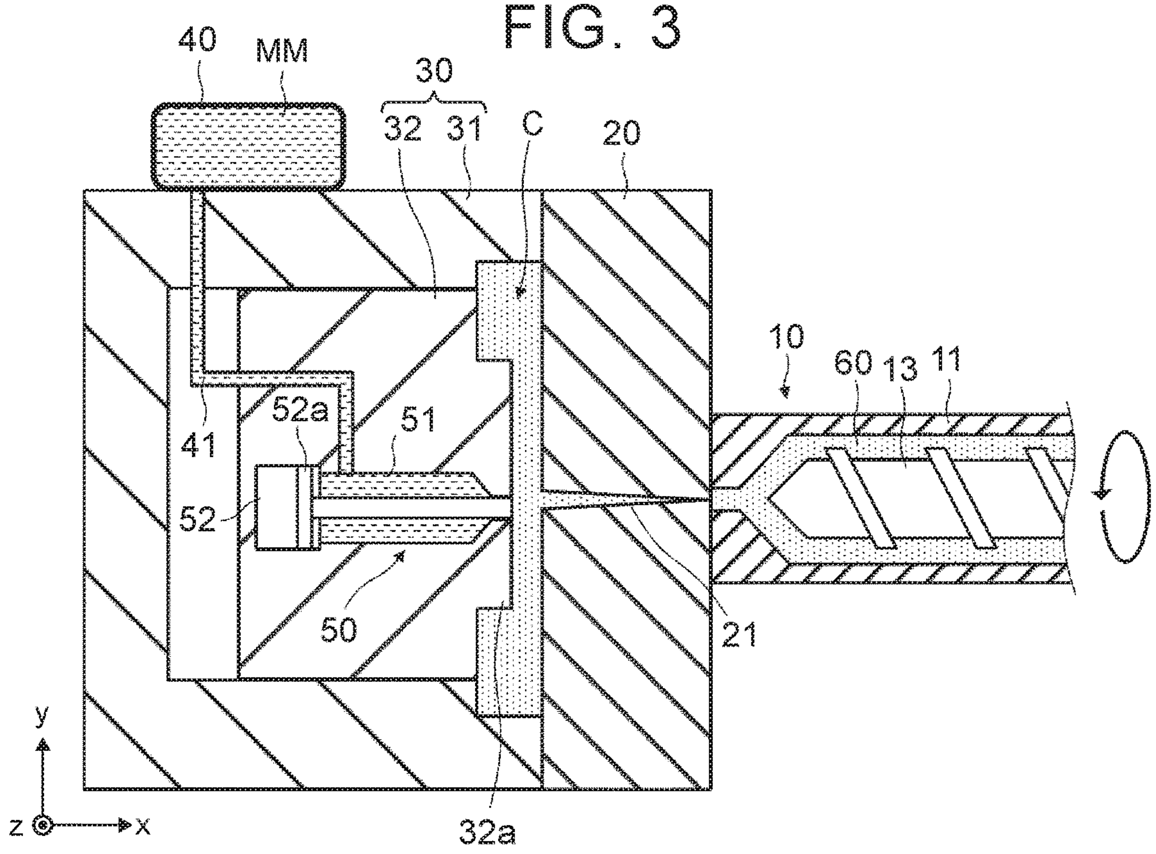
FIG. 3 is a schematic horizontal sectional view to describe the operation of the manufacturing apparatus according to the first embodiment.

The fixed die 20 is a die fixed to the injection machine 10. In the meantime, the movable die 30 is a die movable slidably in the x-axis direction. Here, FIG. 3 is a schematic horizontal sectional view to describe the operation of the manufacturing apparatus according to the first embodiment. FIG. 3 illustrates a state where the molten resin 60 is filled between the fixed die (a cavity die) 20 and the movable die (a core die) 30 abutting with each other. As illustrated in FIG. 3, when the movable die 30 moves from the state illustrated in FIG. 2 to the x-axis positive direction so as to abut with the fixed die 20, a cavity C corresponding to a resin substrate to be molded by injection molding between the fixed die 20 and the movable die 30 is formed. Then, the molten resin 60 is filled into the cavity C from the injection machine 10.

As illustrated in FIG. 1, the fixed die 20 is a die having a rectangular solid shape. As illustrated in FIG. 2, the fixed die 20 includes a sprue 21 formed to penetrate through the fixed die 20 in the x-axis direction. An open end, on the x-axis positive direction side, of the sprue 21 is connected to the outlet of the injection machine 10. An open end, on the x-axis negative direction side, of the sprue 21 is connected to the cavity. That is, the molten resin 60 injected from the injection machine 10 is filled into the cavity C through the sprue 21 of the fixed die 20. The sprue 21 has a circular section and the diameter of the sprue 21 gradually increases from the injection machine 10 side toward the cavity C. The mold surface of the fixed die 20 is flat so that a first principal surface of the resin substrate is molded flatly by the mold surface of the fixed die 20.

As illustrated in FIGS. 1, 2, the movable die 30 has a nested structure in which a movable core 32 is accommodated in a movable main mold 31. The movable main mold 31 is a box-shaped die opened on a surface facing the fixed die 20 and is slidable in the x-axis direction. The movable core 32 is a rectangular solid die accommodated in the fixed die 20 in a slidable manner in the x-axis direction inside the fixed die 20. As illustrated in FIGS. 1, 2, a projection portion 32*a* for molding a wiring gutter on the resin substrate is formed on the mold surface of the movable core 32. That is, the wiring gutter is molded on a second principal surface of the resin substrate by the mold surface of the movable core 32. Note that, in the example illustrated in FIGS. 1, 2, a recessed portion 33 for constituting the cavity C is not formed in the fixed die 20 called the cavity die, but the recessed portion 33 is formed in the movable die 30.

As illustrated in FIGS. 1, 2, the supply tank 40 is a tank for supplying a molten metal MM to the injector 50 from outside of the movable die 30 and is provided on an outer wall of the movable main mold 31. Since the supply tank 40 is provided, the molten metal MM can be supplied to the injector 50 without removing the injector 50, thereby improving productivity.

Here, the solidifying point of the molten metal MM is lower than the solidifying point of the molten resin 60 that is thermoplastic resin. For example, when the solidifying point of the molten resin 60 is 150° C., it is preferable that the solidifying point of the molten metal MM be 130° C. or less. A concrete example of a low-melting alloy constituting the molten metal MM is an Sn—In—Bi based lead-free solder having a solidifying point of around 80° C. A concrete example of the thermoplastic resin constituting the molten resin 60 is polypropylene (PP), ABS resin, polycarbonate (PC), and the like having a solidifying point of around 150° C.

Further, as illustrated in FIGS. 1, 2, the injector 50 is placed inside the movable core 32. The injector 50 is configured to inject the molten metal MM into the wiring gutter of the resin substrate molded by injection molding and includes a sleeve 51 and a cylinder 52. The sleeve 51 is a cylindrical metal member that retains the molten metal MM. The sleeve 51 is connected to the supply tank 40 via a pipe 41. The molten metal MM is supplied to the sleeve 51 from the supply tank 40 via the pipe 41. A front end portion (an end on the x-axis positive direction side) of the sleeve 51 is narrowed and its tip end is provided with an inlet.

The cylinder 52 includes a piston 52*a* for opening and closing the inlet of the sleeve 51. In FIG. 2, a front end of a piston rod of the piston 52*a* is inserted into the inlet of the sleeve 51, so that the inlet of the sleeve 51 is closed. When the piston 52*a* moves in the x-axis negative direction, the front end of the piston rod of the piston 52*a* is removed from the inlet of the sleeve 51, and the molten metal MM is poured into the wiring gutter of the resin substrate via the inlet of the sleeve 51. On this account, the inlet of the sleeve 51 is provided on the top surface of the projection portion 32*a* for molding the wiring gutter.

Operation of Manufacturing Apparatus of Wiring Board

Figure 4:
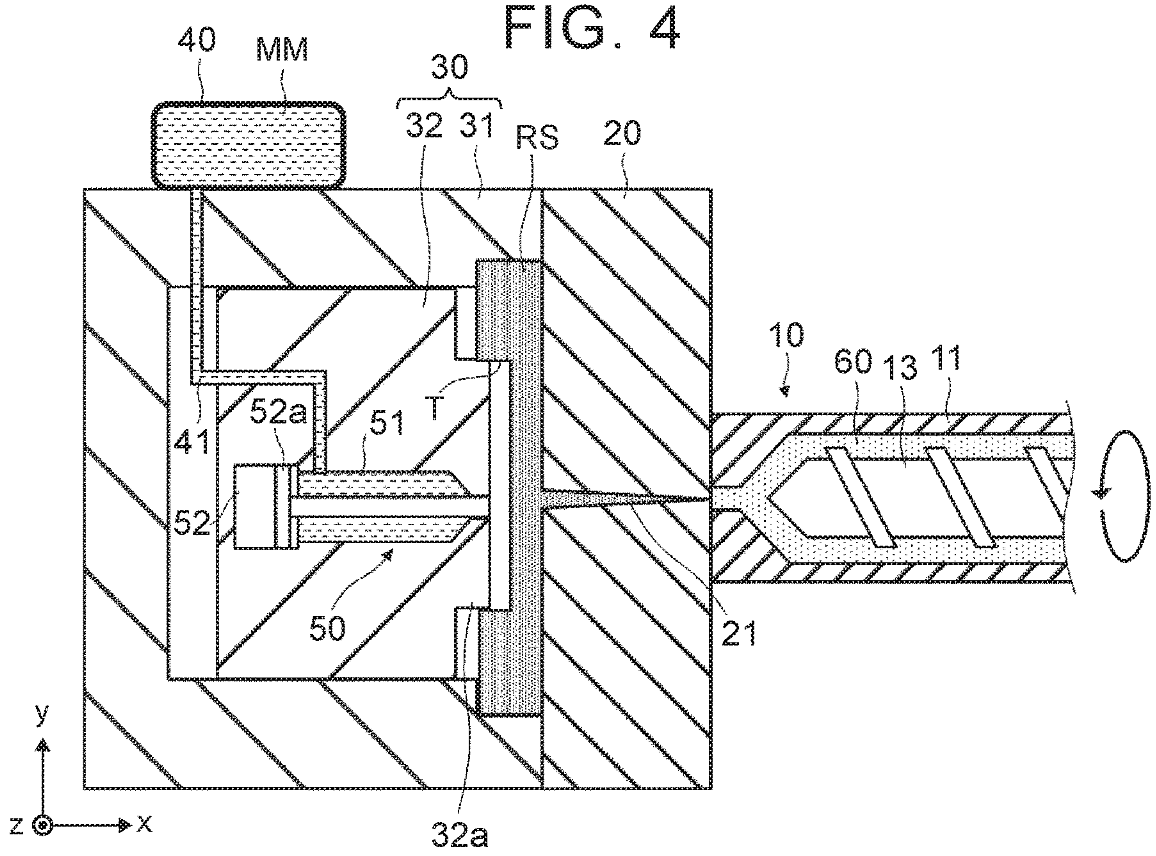
FIG. 4 is a schematic horizontal sectional view to describe the operation of the manufacturing apparatus according to the first embodiment.
Figure 5:
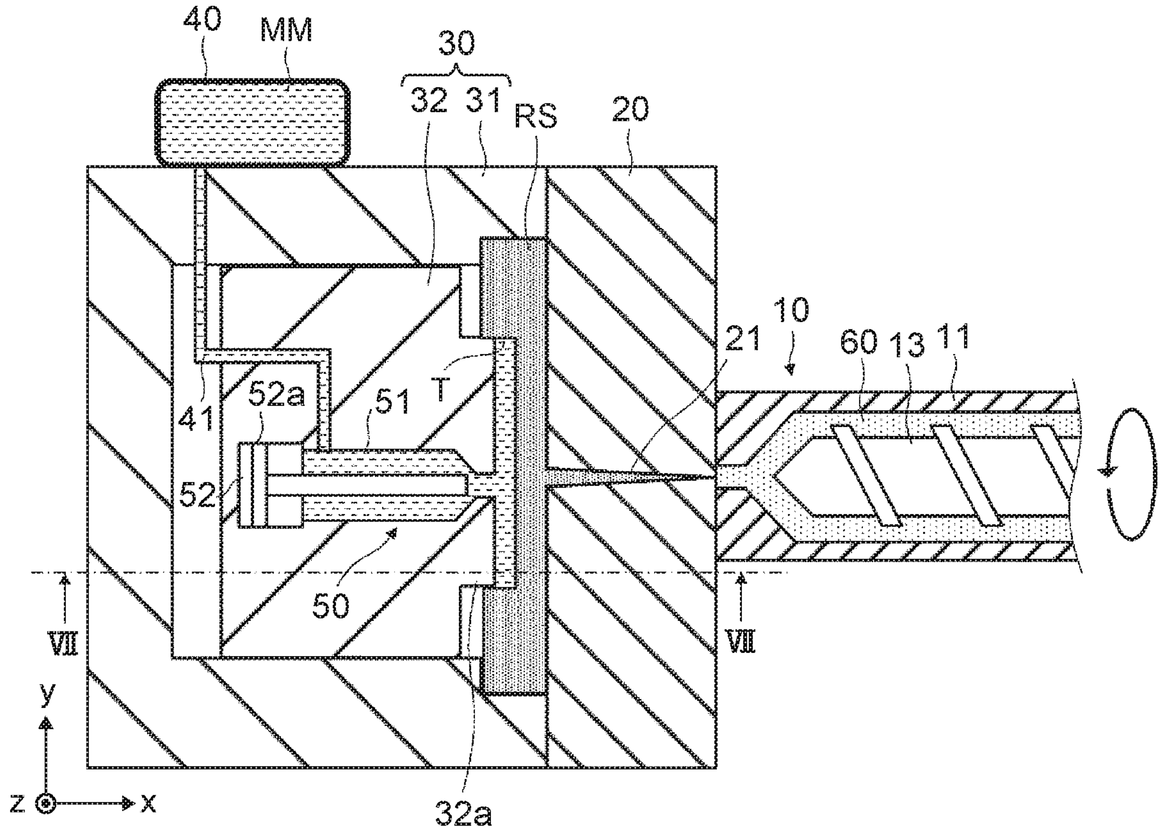
FIG. 5 is a schematic horizontal sectional view to describe the operation of the manufacturing apparatus according to the first embodiment.
Figure 6:
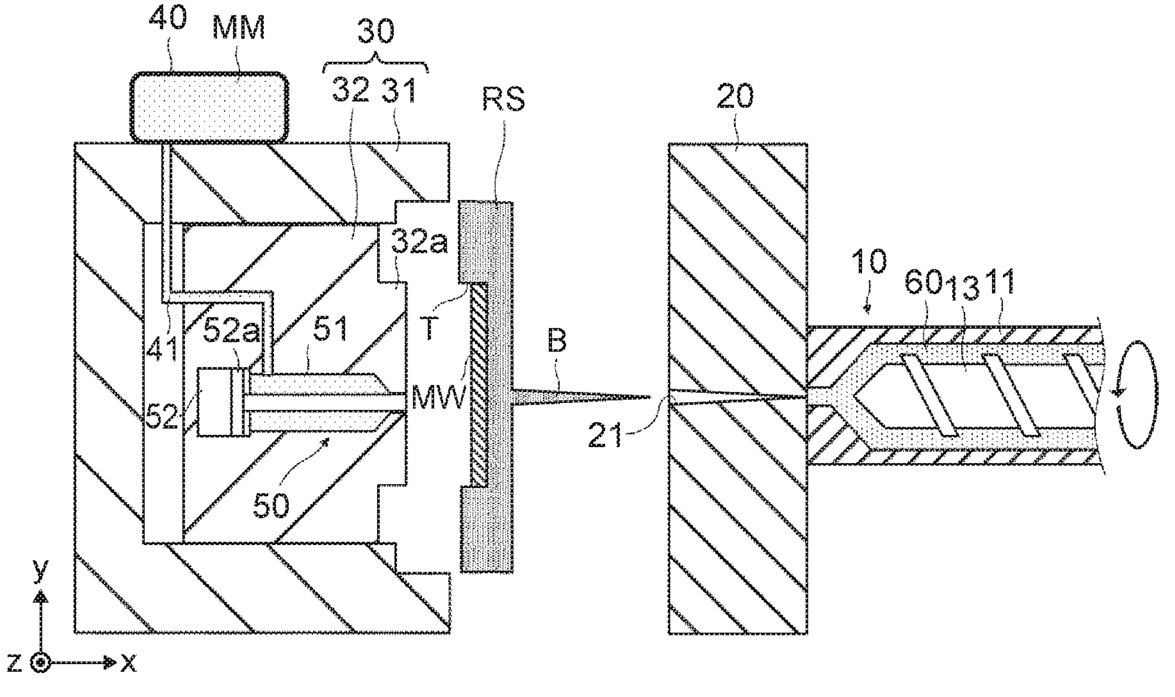
FIG. 6 is a schematic horizontal sectional view to describe the operation of the manufacturing apparatus according to the first embodiment.

With reference to FIGS. 4 to 6 in addition to FIGS. 2, 3 that are referred to in the above description, the operation of the manufacturing apparatus according to the first embodiment, that is, a manufacturing method of a wiring board according to the first embodiment will be described. FIGS. 4 to 6 are schematic horizontal sectional views to describe the operation of the manufacturing apparatus according to the first embodiment.

First, as illustrated in FIG. 2, the fixed die 20 and the movable die 30 are separated from each other. Subsequently, as illustrated in FIG. 3, the movable die 30 moves forward (that is, moves to the x-axis positive direction) so as to abut with the fixed die 20, so that the cavity C corresponding to the resin substrate to be molded by injection molding between the fixed die 20 and the movable die 30 is formed. Then, the molten resin 60 is filled into the cavity C from the injection machine 10.

Subsequently, as illustrated in FIG. 4, the molten resin 60 filled in the cavity C is cooled off to solidify, so that the molten resin 60 is turned into a resin substrate RS. Here, a wiring gutter T molded by the projection portion 32*a* of the movable core 32 is formed on a principal surface of the resin substrate RS on the movable die 30 side. After that, as illustrated in FIG. 4, only the movable core 32 moves back (that is, moves to the x-axis negative direction). Hereby, a gap is formed between the projection portion 32*a* of the movable core 32 and the wiring gutter T of the resin substrate RS. The backward-motion distance of the movable core 32 is shorter than the height of the projection portion 32*a* of the movable core 32. Accordingly, after the movable core 32 moves back, a front end portion (an end on the x-axis positive direction side) of the projection portion 32*a* abuts with the wall surface of the wiring gutter T of the resin substrate RS in a surrounded manner.

Subsequently, as illustrated in FIG. 5, the piston 52*a* of the injector 50 moves back (that is, moves to the x-axis negative direction). Hereby, the front end of the piston rod of the piston 52*a* is removed from the inlet of the sleeve 51 of the injector 50, and the molten metal MM is poured into the wiring gutter T of the resin substrate RS via the inlet of the sleeve 51.

Figure 7:
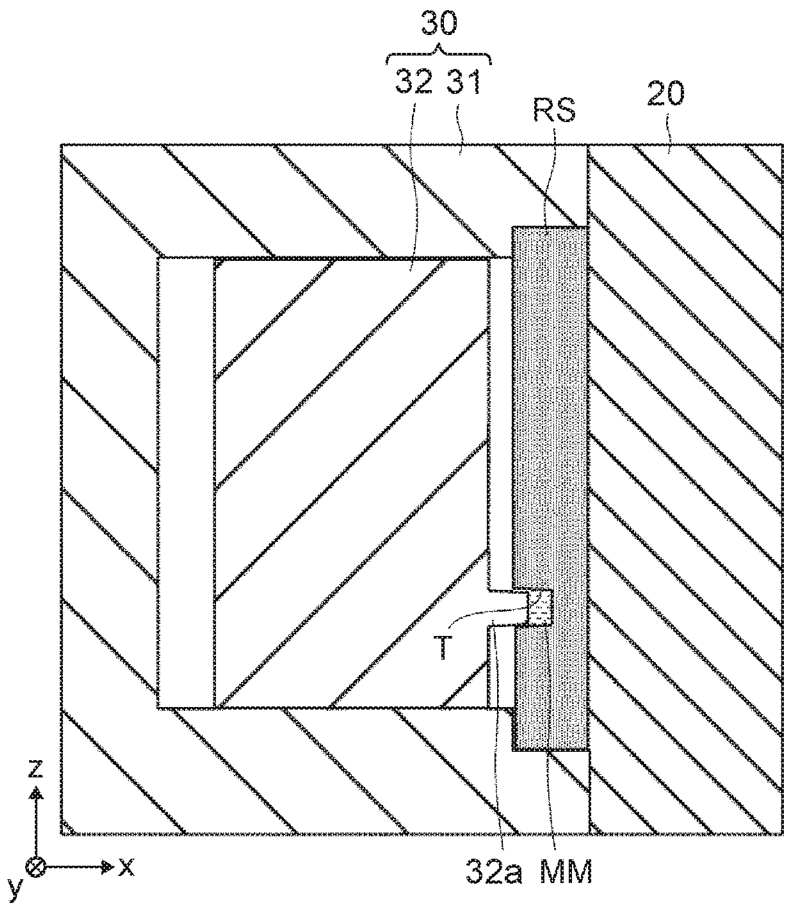
FIG. 7 is a schematic vertical sectional view taken along a section line VII-VII in FIG. 5.

Here, FIG. 7 is a schematic vertical sectional view taken along a section line VII-VII in FIG. 5. As illustrated in FIGS. 5, 7, the front end portion (the end on the x-axis positive direction side end) of the projection portion 32*a* abuts with the wall surface of the wiring gutter T of the resin substrate RS in a surrounded manner, thereby making it possible to restrain a leak of the molten metal MM from the wiring gutter T. After a predetermined amount of the molten metal MM is injected, the piston 52*a* of the injector 50 moves forward (that is, moves to the x-axis positive direction) and finishes injection of the molten metal MM.

Finally, as illustrated in FIG. 6, the molten metal MM injected into the wiring gutter T is cooled off to solidify, so that the molten metal MM is turned into a metal wiring MW. After that, as illustrated in FIG. 6, the whole movable die 30 moves back (that is, moves to the x-axis negative direction). Hereby, the wiring board in which the metal wiring MW is formed on the resin substrate RS is taken out of the injection molding machine. Note that a burr B molded by the sprue 21 of the fixed die 20 will be removed later from the resin substrate RS.

Description of Effects

As described above, the manufacturing apparatus according to the first embodiment includes the movable die 30 having a nested structure in which the movable core 32 is accommodated in the movable main mold 31. The injector 50 configured to inject the molten metal MM into the wiring gutter of the resin substrate molded by injection molding is placed inside the movable core 32. Hereby, as illustrated in FIGS. 4, 5, after injection molding of the resin substrate RS, only the movable core 32 moves back, so that the molten metal MM can be injected into the wiring gutter T of the resin substrate RS from the injector 50. Thus, the manufacturing apparatus according to the first embodiment is excellent in productivity because a wiring line can be formed inside a die for injection molding and it is unnecessary to form and peel off a mask coating.

Further, the manufacturing apparatus according to the first embodiment uses the molten metal MM without using conductive ink or conductive paste that requires a drying step. Since the molten metal MM is superior to the conductive ink and the conductive paste in fluidity due to low viscosity, it is possible to form a wiring line with efficiency.

As an example, the viscosity of the molten metal MM made of low-melting metal can be set to about 1/10 of the viscosity of the conductive ink.

Further, a large part of the conductive ink is solvent and the solvent is removed in a drying step, so it is difficult to form a thick wiring line. For example, the thickness of a wiring line made of the conductive ink is about 50 μm, for example, so that the wiring line cannot be used for purposes other than signal wires. In the meantime, in the case of the molten metal MM, only solidification shrinkage occurs, so that a thick wiring line can be easily molded. As an example, the thickness of the wiring line formed by solidifying the molten metal MM made of low-melting metal is about 20 times the thickness of the wiring line made of the conductive ink, that is, about 1 mm. Accordingly, the wiring line made of the molten metal MM is also usable for purposes of power lines for a wiper, a room lamp, an automatic window, and the like in an automobile, for example.

Further, in the case where a wiring board is manufactured by use of the conductive ink, a step of forming a circuit wiring in a wiring gutter and the drying step are required separately from a step of molding a resin substrate by injection molding. In the case where a wiring board is manufactured by use of the manufacturing apparatus according to the first embodiment, the step of forming a circuit wiring and the drying step are not required separately. On this account, as an example, a manufacturing time in the case where a wiring board is manufactured by use of the manufacturing apparatus according to the first embodiment can be reduced to about 1/60 of a manufacturing time in the case where a wiring board is manufactured by use of the conductive ink.

Modification of First Embodiment

Figure 8:
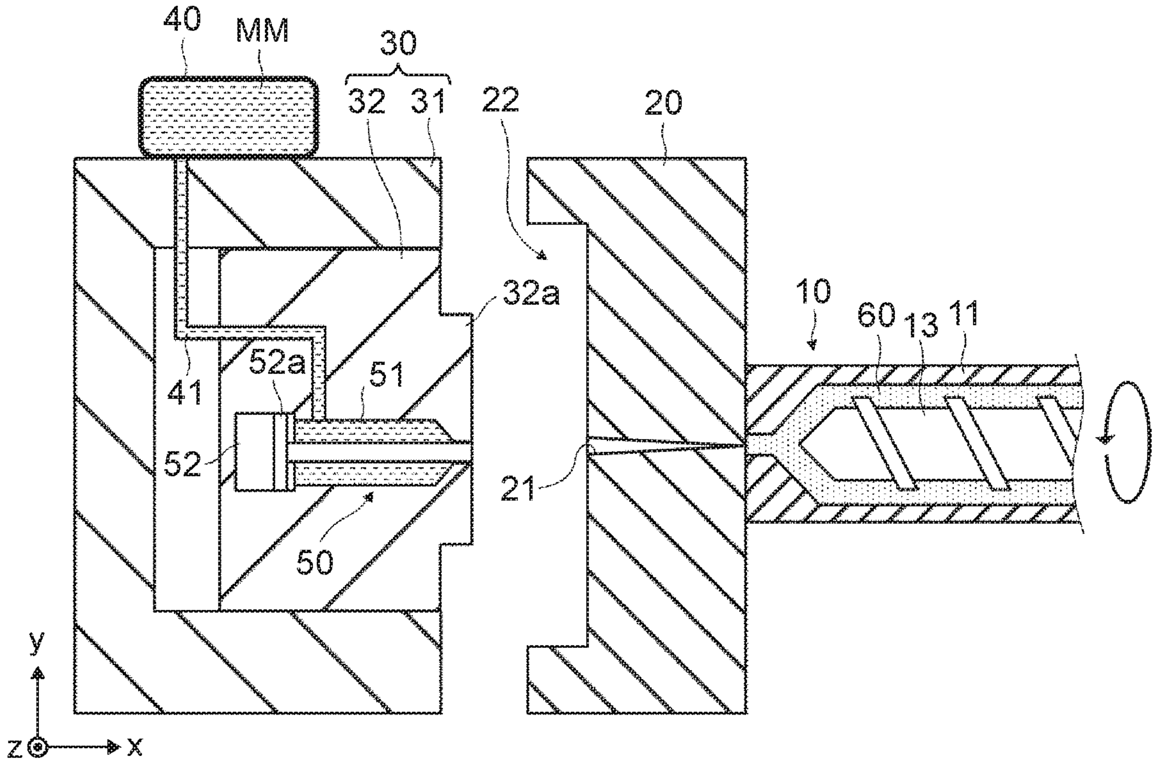
FIG. 8 is a schematic horizontal sectional view of a manufacturing apparatus of a wiring board according to a modification of the first embodiment.
Figure 9:
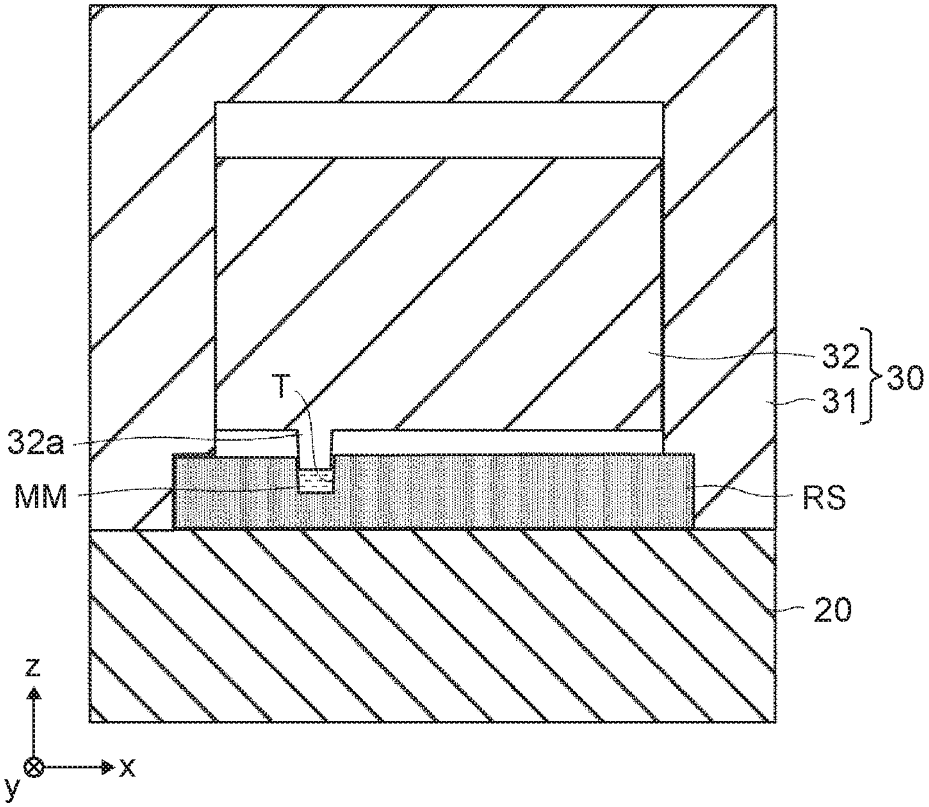
FIG. 9 is a schematic vertical sectional view of the manufacturing apparatus according to the modification of the first embodiment.

Next will be described a configuration of a manufacturing apparatus of a wiring board according to a modification of the first embodiment with reference to FIGS. 8 and 9. FIG. 8 is a schematic horizontal sectional view of the manufacturing apparatus according to the modification of the first embodiment. FIG. 8 is a figure corresponding to FIG. 2. FIG. 9 is a schematic vertical sectional view of the manufacturing apparatus according to the modification of the first embodiment. FIG. 9 is a figure corresponding to FIG. 7.

In the manufacturing apparatus according to the first embodiment as illustrated in FIG. 2, the recessed portion 33 for constituting the cavity C is not formed in the fixed die 20 called the cavity die, but the recessed portion 33 is formed in the movable die 30. On the other hand, as illustrated in FIG. 8, a recessed portion 22 for constituting the cavity C may not be formed in the movable die 30, but the recessed portion 22 may be formed in the fixed die 20. The other configurations are the same as those of the manufacturing apparatus according to the first embodiment as illustrated in FIG. 2, so descriptions thereof are omitted.

Further, as illustrated in FIG. 7, in the manufacturing apparatus according to the first embodiment, the principal surface of the resin substrate RS to be molded is perpendicular to the horizontal direction, so that the wiring gutter T is opened on the x-axis negative-direction side, that is, a lateral side. On the other hand, as illustrated in FIG. 9, FIG. 7 may be turned right by 90°, so that the principal surface of the resin substrate RS to be molded may be parallel to the horizontal direction and the wiring gutter T may be opened on the z-axis positive-direction side, that is, on the upper side. With such a configuration, it is possible to further restrain a leak of the molten metal MM from the wiring gutter T. The other configurations are the same as those of the manufacturing apparatus according to the first embodiment as illustrated in FIG. 7, so descriptions thereof are omitted.

Second Embodiment

Figure 10:
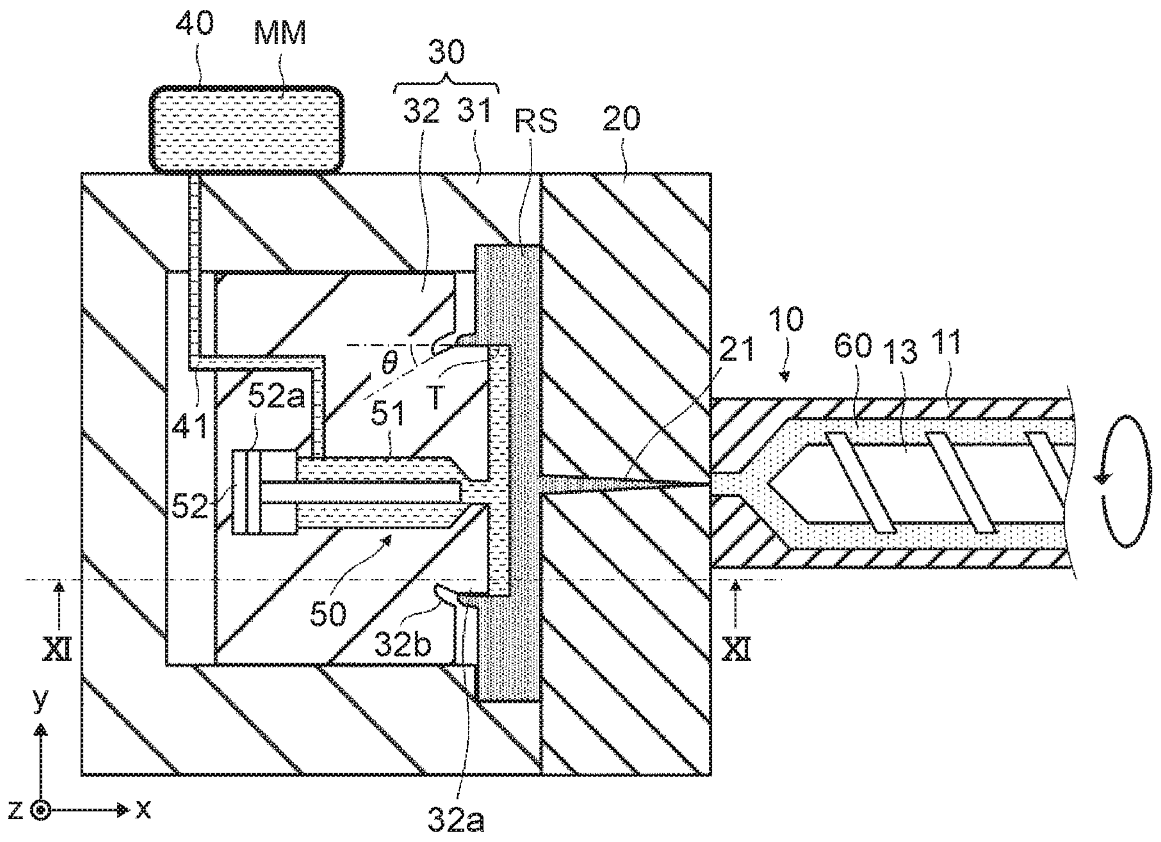
FIG. 10 is a schematic horizontal sectional view to describe the operation of a manufacturing apparatus of a wiring board according to a second embodiment.
Figure 11:
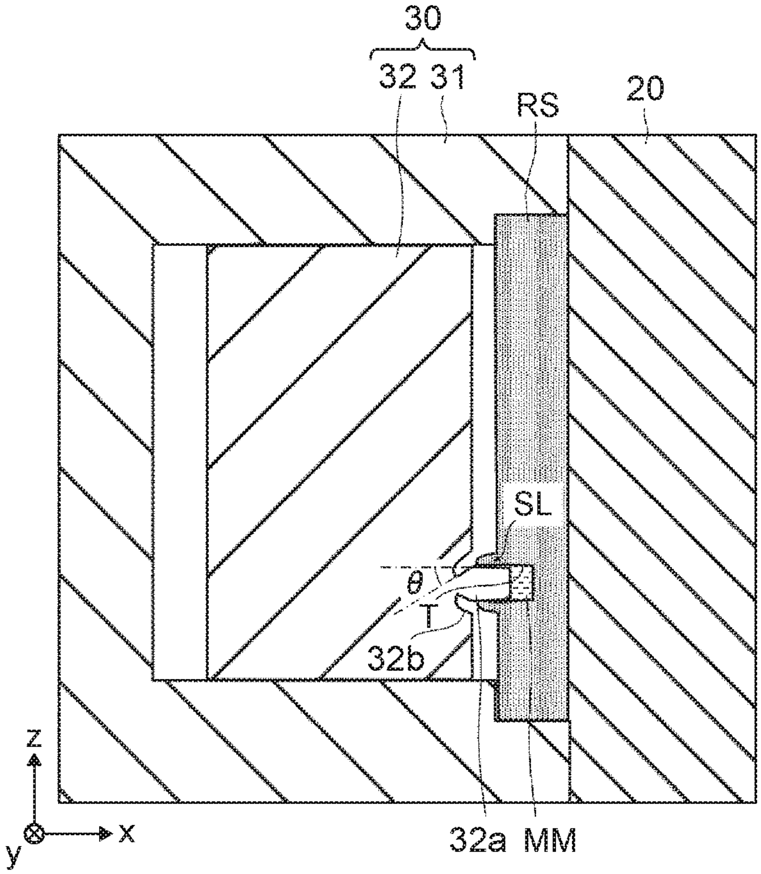
FIG. 11 is a schematic vertical sectional view taken along a section line XI-XI in FIG. 10.

Next will be described a configuration of a manufacturing apparatus of a wiring board according to a second embodiment with reference to FIGS. 10 and 11. FIG. 10 is a schematic horizontal sectional view to describe the operation of the manufacturing apparatus according to the second embodiment. FIG. 10 is a figure corresponding to FIG. 5. FIG. 11 is a schematic vertical sectional view taken along a section line XI-XI in FIG. 10. FIG. 11 is a figure corresponding to FIG. 7.

As illustrated in FIGS. 10, 11, in the manufacturing apparatus according to the second embodiment, a seal lip molding groove **32*b* is formed in the root of the projection portion 32*a* of the movable core 32 so as to surround the whole circumference of the projection portion 32*a*. Accordingly, a seal lip SL extending from the wall surface of the wiring gutter T and projecting from the principal surface of the resin substrate RS is molded in the whole peripheral edge of the wiring gutter T of the resin substrate RS. The seal lip molding groove 32*b* is formed so as to get into the lower side of the projection portion 32*a***. Accordingly, the seal lip SL inclines toward the wiring gutter T side and projects from the principal surface of the resin substrate RS.

An angle θ ($0° < θ < 90°$) formed between the wall surface of the seal lip molding groove **32*b* and the normal direction of the mold surface of the movable core 32 is around 30°, for example, but can be set appropriately. The depth of the seal lip molding groove 32*b*** is around 1 mm as an example, but can be set appropriately.

With such a configuration, as illustrated in FIGS. 10, 11, the inner wall of the seal lip SL around the whole peripheral edge of the wiring gutter T makes close contact with the projection portion **32*a* of the movable core 32 at the time when the molten metal MM is poured into the wiring gutter T of the resin substrate RS. As a result, the manufacturing apparatus according to the second embodiment can further restrain a leak of the molten metal MM from the wiring gutter T in comparison with the manufacturing apparatus according to the first embodiment as illustrated in FIGS. 5, 7**.

Note that the disclosure is not limited to the above embodiments, and various modifications can be made within a range that does not deviate from the gist of the disclosure.

What is claimed is:

1. A manufacturing apparatus of a wiring board, the manufacturing apparatus comprising:

a fixed die;

a movable die configured to abut with the fixed die to form a cavity, wherein the cavity is configured to mold a resin substrate having a wiring gutter thereto; and an injection machine that operatively communicates with an opening of the fixed die, the injection machine configured to inject molten resin into the cavity via the opening of the fixed die, wherein:

the movable die includes a movable main mold, and a movable core having a nested structure in which the movable core is slidably accommodated in the movable main mold;

the movable core comprises a wall surface that has a projection portion configured to mold the wiring gutter;

the movable die further comprises an injector configured to inject molten metal into the wiring gutter via the projection portion, the injector provided inside the movable core; and after the molten resin injected from the injection machine solidifies inside the cavity such that the resin substrate having the wiring gutter is molded, the movable core is further configured to move back and the injector is configured to then inject the molten metal into the wiring gutter of the molded resin substrate.

2. The manufacturing apparatus according to claim 1, wherein:

the movable core includes a seal lip molding groove formed in a root of the projection portion so as to surround the projection portion and get into a lower side of the projection portion; and the seal lip molding groove is configured to mold a seal lip in a peripheral edge of the wiring gutter of the resin substrate to be molded, such that the seal lip extends from a wall surface of the wiring gutter, inclines toward a wiring gutter side, and projects from a principal surface of the resin substrate.

3. The manufacturing apparatus according to claim 1, further comprising a supply tank configured to supply the molten metal to the injector, wherein the supply tank is provided on an outer wall of the movable main mold.

4. The manufacturing apparatus according to claim 1, wherein the movable core is slidable in a direction where the projection portion projects.

* * * * *